(12) United States Patent
Kodaira et al.

(10) Patent No.: US 7,843,041 B2
(45) Date of Patent: Nov. 30, 2010

(54) THIN-FILM CIRCUIT DEVICE HAVING A LOW STRENGTH REGION, METHOD FOR MANUFACTURING THE THIN-FILM CIRCUIT DEVICE, AND ELECTRONIC APPARATUS

(75) Inventors: Taimei Kodaira, Chino (JP); Sumio Utsunomiya, Suwa (JP)

(73) Assignee: Seiko Epson Corporation (JP)

( * ) Notice: Subject to any disclaimer, the term of this patent is extended or adjusted under 35 U.S.C. 154(b) by 652 days.

(21) Appl. No.: 11/625,978

(22) Filed: Jan. 23, 2007

(65) Prior Publication Data
US 2007/0173031 A1  Jul. 26, 2007

(30) Foreign Application Priority Data
Jan. 24, 2006 (JP) ............... 2006-015595
Oct. 5, 2006 (JP) ............... 2006-273536

(51) Int. Cl.
*H01L 29/06* (2006.01)
*H01L 23/58* (2006.01)

(52) U.S. Cl. ............ 257/622; 257/618; 257/620; 257/629; 257/632; 257/635; 257/638; 257/647; 438/457; 438/978

(58) Field of Classification Search .......... 257/618, 257/620, 622, 629, 632, 635, 638, 647; 438/457, 438/978
See application file for complete search history.

(56) References Cited

U.S. PATENT DOCUMENTS

2004/0070053 A1 * 4/2004 Ohara ............... 257/618
2005/0039673 A1   2/2005 Ishida

FOREIGN PATENT DOCUMENTS

JP         10-125931         5/1998

* cited by examiner

*Primary Examiner*—Thanh V Pham
(74) *Attorney, Agent, or Firm*—Harness, Dickey & Pierce, P.L.C.

(57) ABSTRACT

A thin-film circuit device includes a substrate and a thin-film circuit layer, disposed on the substrate, having an element region and a low-strength region. The element region includes thin-film elements. The low-strength region extends between an end portion of the thin-film circuit layer and the element region and has a mechanical strength less than that of the surroundings of the low-strength region.

8 Claims, 13 Drawing Sheets

(a)   (b)   (c)   (d)   (e)

THIN-FILM CIRCUIT DEVICE HAVING A LOW STRENGTH REGION, METHOD FOR MANUFACTURING THE THIN-FILM CIRCUIT DEVICE, AND ELECTRONIC APPARATUS

BACKGROUND

1. Technical Field

The present invention relates to a thin-film circuit device (thin-film semiconductor device) including a thin-film circuit layer, disposed on a flexible substrate, including semiconductor elements; a method for manufacturing such a thin-film circuit device; and an electronic apparatus including such a thin-film circuit device.

2. Related Art

Thin-film circuit devices include substrates; thin-film circuit layers, disposed on the substrates, including semiconductor elements; and other components. The substrates are usually prepared from single-crystal silicon wafers, quartz glass wafers, heat-resistant glass wafers, resin films, or the like. These wafers are selected depending on the required performance and functions of the thin-film circuit devices. In particular, the resin films are preferable because a substrate prepared from a resin film is thin and flexible and therefore a thin-film circuit device including the substrate is light-weighted and flexible.

Examples of methods for manufacturing thin-film circuit devices including substrates prepared from resin films include a method in which a semiconductor layer, an insulating layer, a metal layer, and the like are deposited on a resin film in that order and a method in which a thin-film circuit layer is formed on a heat-resistant substrate, released from the heat-resistant substrate, and then joined to a resin film (a release transfer process). Japanese Unexamined Patent Application Publication No. 10-125931 (hereinafter referred to as Patent Document 1) discloses a method for manufacturing a thin-film circuit device by a release transfer process.

A thin-film circuit device including a substrate prepared from a resin film can have defects due to a difference in physical property between the substrate and a thin-film circuit layer.

The thin-film circuit layer usually includes an inorganic thin-film formed by depositing an inorganic material on the substrate by a chemical vapor deposition (CVD) process or a sputtering process. The inorganic thin-film has a large elastic constant of several ten gigapascals and a small linear expansion coefficient of several to 10 or more ppm/K. On the other hand, the resin film has a large linear expansion coefficient of about 10 to 50 ppm/K.

In the thin-film circuit device, since such materials having different physical properties are joined to each other, a change in temperature causes thermal stresses in the substrate and the thin-film circuit layer because of the difference in linear expansion coefficient. Since the thin-film circuit layer usually has a small thickness of several micrometers and a small cross-sectional area, a large thermal stress is developed in the thin-film circuit layer. If the thermal stress exceeds the breaking strength of the thin-film circuit layer, the thin-film circuit layer is broken. This causes the failure of the thin-film circuit device.

When the substrate is distorted or bent, a bending stress is developed in the thin-film circuit layer. Even a small strain causes a large stress in the thin-film circuit layer because the thin-film circuit layer has a large elastic constant of several ten gigapascals. Therefore, the stress caused by distortion such as bending can break the thin-film circuit layer.

End portions of the thin-film circuit device can have fine cracks or notches formed in a cutting step in which the thin-film circuit device is separated from other thin-film circuit devices. Large stresses are developed in the end portions thereof because of stress concentration; hence, the end portions thereof serve as weak points that may cause the breakage of the thin-film circuit device.

SUMMARY

An advantage of an aspect of the invention is to provide a thin-film circuit device having high reliability.

An advantage of another aspect of the invention is to provide a method for manufacturing such a thin-film circuit device. An advantage of another aspect of the invention is to provide an electronic apparatus including such a thin-film circuit device.

A first aspect of the present invention provides a thin-film circuit device, which includes a substrate and a thin-film circuit layer, disposed on the substrate, having an element region and a low-strength region. The element region includes thin-film elements. The low-strength region extends between an end portion of the thin-film circuit layer and the element region and has a mechanical strength less than that of the surroundings of the low-strength region.

A second aspect of the present invention provides a thin-film circuit device, which includes a substrate and a thin-film circuit layer, disposed on the substrate, having an element region and a low-strength region. The element region includes thin-film elements. The low-strength region extends between an end portion of the thin-film circuit layer and the element region to surround the element region and has a mechanical strength less than that of the surroundings of the low-strength region.

Since the thin-film circuit devices have the above configurations, the low-strength regions can prevent cracks developed in end portions of the thin-film circuit devices from reaching the element regions. In the thin-film circuit device according to the second aspect, the low-strength region surrounds the element region, cracks can be prevented from propagating to the element region from outside.

In the thin-film circuit device according to the first or second aspect, the low-strength region preferably surrounds the element region several times. This securely prevents cracks from propagating to the element region.

In the thin-film circuit device according to the first or second aspect, the low-strength region preferably has a groove surrounding the element region. This allows the low-strength region to partly have a thickness less than that of other regions. Therefore, the low-strength region has a mechanical strength less than that of the surroundings thereof.

In the thin-film circuit device according to the first or second aspect, the low-strength region preferably has a plurality of grooves surrounding the element region. This securely prevents cracks from propagating to the element region.

In the thin-film circuit device according to the first or second aspect, the groove or grooves preferably have a V shape, an inverted trapezoidal shape, a rectangular shape, a semi-circular shape, or a semi-elliptical shape in cross section or partly have any one of these shapes in cross section. The groove or grooves preferably have a depth that is 50% or more of the thickness of the thin-film circuit layer and more preferably about 50% to 85% thereof.

When the groove or grooves have a V shape in cross section, the low-strength region has a linear portion which is located at the bottom of the groove and which has the smallest thickness or has linear portions which are located at the bottoms of the respective grooves and which have the smallest thickness. This allows the low-strength region to function well.

When the groove or grooves have a semi-elliptical shape or partly have a semi-elliptical shape in cross section, the low-strength region has a linear portion which is located at the bottom of the groove and which has the smallest thickness or has linear portions which are located at the bottoms of the respective grooves and which have the smallest thickness. This allows the low-strength region to function well.

In the thin-film circuit device according to the first or second aspect, when the low-strength region has the grooves, the element region can be securely protected. This allows the thin-film circuit device to have high reliability.

A third aspect of the present invention provides an electronic apparatus including the thin-film circuit device of the first or second aspect. The thin-film circuit device hardly breaks down; hence, the electronic apparatus has high reliability.

A fourth aspect of the present invention provides a method for manufacturing a thin-film circuit device including a substrate and a thin-film circuit layer disposed on the substrate. The method includes forming an element region including thin-film elements on the substrate and forming a low-strength region having a low mechanical strength around the element region. The low-strength region is formed simultaneously with the formation of contact holes in the element region.

The method is effective in manufacturing the thin-film circuit device at low cost.

In the method, the low-strength region is preferably formed by etching the thin-film circuit layer. This allows the contact holes and the low-strength region to be formed in one step, resulting in a reduction in manufacturing cost.

The method preferably further includes fabricating the thin-film circuit layer on a heat-resistant substrate, releasing the thin-film circuit layer from the heat-resistant substrate, and then transferring the thin-film circuit layer to a flexible substrate. This technique is called a release transfer process and is useful in providing a thin-film circuit layer, including high-performance thin-film transistors fabricated at high temperature, on a resin substrate having low heat resistance.

BRIEF DESCRIPTION OF THE DRAWINGS

The present invention will be described with reference to the accompanying drawings, wherein like numbers reference like elements.

DESCRIPTION OF EXEMPLARY EMBODIMENTS

Embodiments of the present invention will now be described with reference to accompanying drawings.

Thin-film circuit devices according to preferred embodiments of the present invention include substrates and thin-film circuit layers disposed thereon. Low-strength regions having a low mechanical strength extend between end portions of the thin-film circuit devices and element regions for forming thin-film elements to surround the element regions.

Fine cracks and/or irregularities are usually formed in the end portions of the thin-film circuit devices in a cutting step in which the thin-film circuit devices are separated from other thin-film circuit devices. It is very difficult for any technique or process to completely prevent the formation of such fine cracks and/or irregularities. According to the preferred embodiments below, although cracks are developed in the substrates or the end portions of the thin-film circuit devices and propagate inward, the cracks are guided into the low-strength regions and prevented from further propagating inward, thereby preventing the breakage of the element regions.

First Embodiment

A thin-film circuit device according to a first embodiment of the present invention will now be described with reference to FIGS. 1 and 2.

Figure 1:
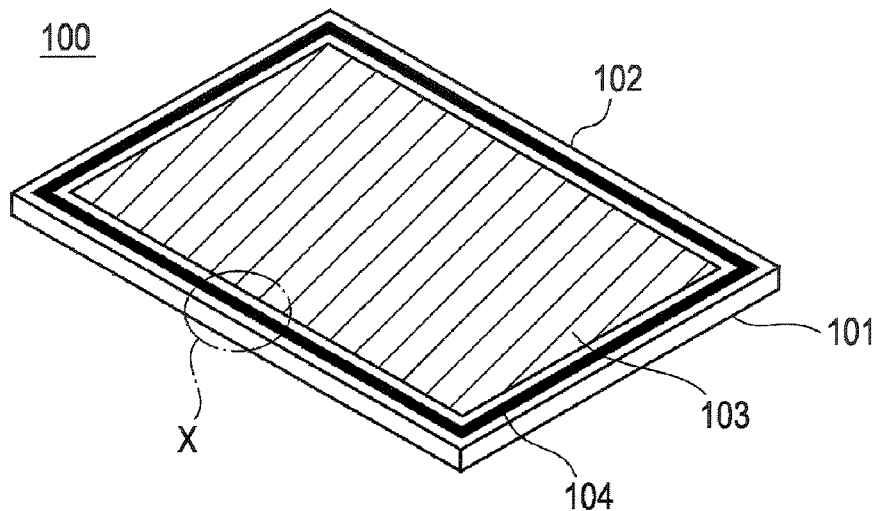
FIG. 1 is a perspective view of a thin-film circuit device according to a first embodiment of the present invention.

FIG. 1 is a perspective view of the thin-film circuit device. With reference to FIG. 1, the thin-film circuit device is represented by reference numeral 100 and includes a substrate 101 and a thin-film circuit layer 102 disposed thereon. In this embodiment, the thin-film circuit layer 102 has the same size as that of the substrate 101 and is formed on the substrate 101 so as to have an extremely small thickness. The thin-film circuit layer 102 may have a size different from that of the substrate 101.

The thin-film circuit layer 102 may be directly formed on the substrate 101 or may be formed on another substrate and then joined to the substrate 101 by the above release transfer process using an adhesive.

The thin-film circuit layer 102 includes an element region 103 and a low-strength region 104 surrounding the element region 103. The element region 103 has a predetermined function and includes, for example, an electric circuit, a display circuit, a mechanical microstructure, and the like. The low-strength region 104 has a mechanical strength less than that of other regions included in the thin-film circuit layer 102. The mechanical strength of the low-strength region 104 can be adjusted in such a manner that the low-strength region 104 is formed so as to have a small thickness, formed from a material having low mechanical strength, or subjected to laser irradiation so as to have low mechanical strength as described below. The low-strength region 104 extends between the element region 103 and an end portion of the substrate 101 (or an end portion of the thin-film circuit layer 102) to surround the element region 103. The low-strength region 104 and an additional low-strength region may surround the element region 103 as described below. The low-strength region 104 need not completely surround the element region 103 but may partially surround the element region 103. This is sufficient to achieve the effect of preventing cracks from propagating inward from the low-strength region 104.

Figure 2:
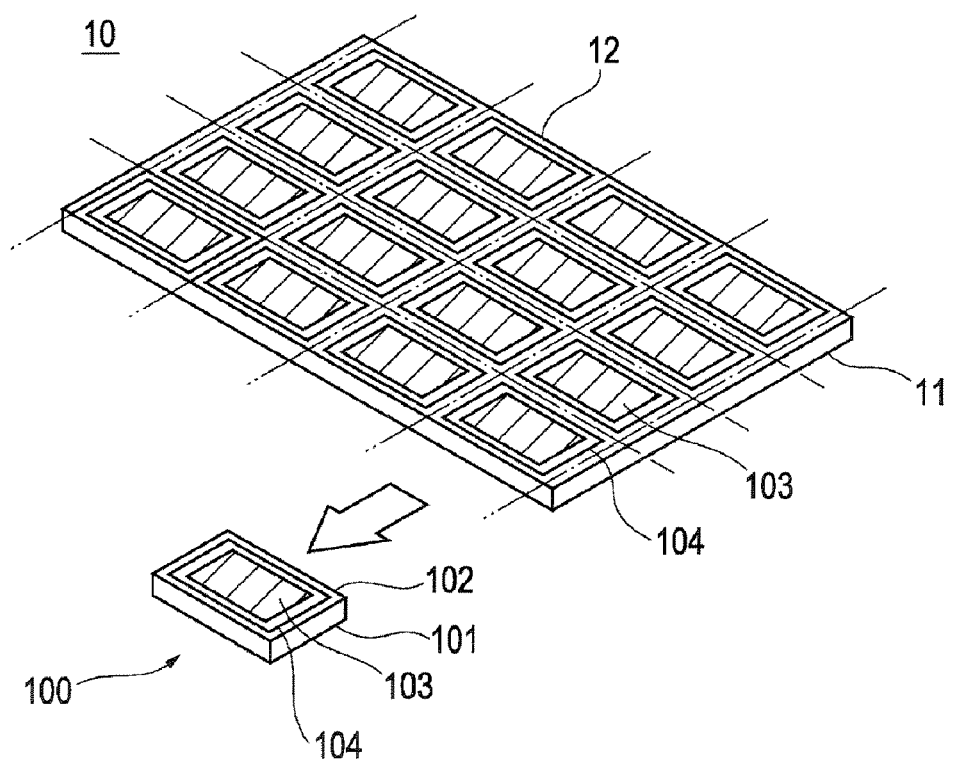
FIG. 2 is an illustration showing a step included in a method for manufacturing the thin-film circuit device of the first embodiment.

FIG. 2 is an illustration showing a step included in a method for manufacturing the thin-film circuit device 100. As shown in FIG. 2, a thin-film circuit section 12 is formed on a wafer 11 with a large size. The thin-film circuit section 12 includes the element region 103, other element regions, the low-strength region 104, and other low-strength regions. The thin-film circuit section 12 has, for example, the same size as that of the wafer 11 and is formed on the wafer 11 so as to have an extremely small thickness.

The wafer 11 is cut into chips, which each have one of the element region 103 and the element regions and one of the low-strength region 104 and the low-strength regions. Examples of a process for cutting the wafer 11 include a mechanical cutting process using a cutting whetstone, a knife, or a pair of scissors; a laser scribing process; and another process. The thin-film circuit device 100 prepared by processing one of the chips can be directly used as a product or used as a component.

A large number of the element and low-strength regions are formed on the wafer 11 and the resulting wafer 11 is cut into the chips as described above. Therefore, the thin-film circuit device 100 can be prepared efficiently.

A function of the low-strength region 104 will now be described with reference to FIGS. 3A to 3C.

Figure 3A:
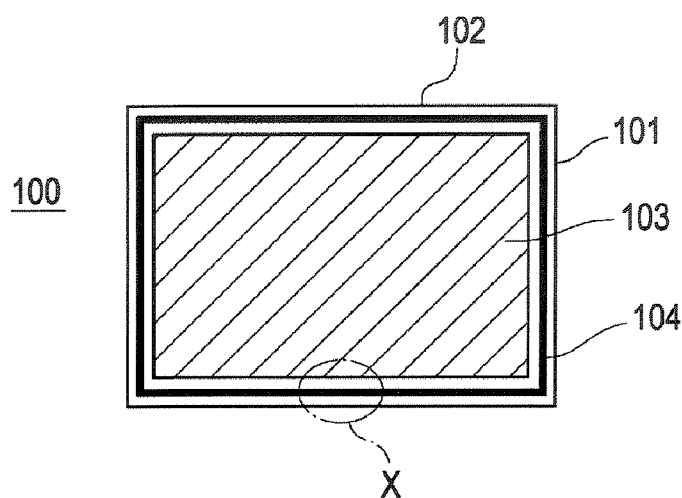
FIG. 3A is a plan view of the thin-film circuit device of the first embodiment.
Figure 3B:
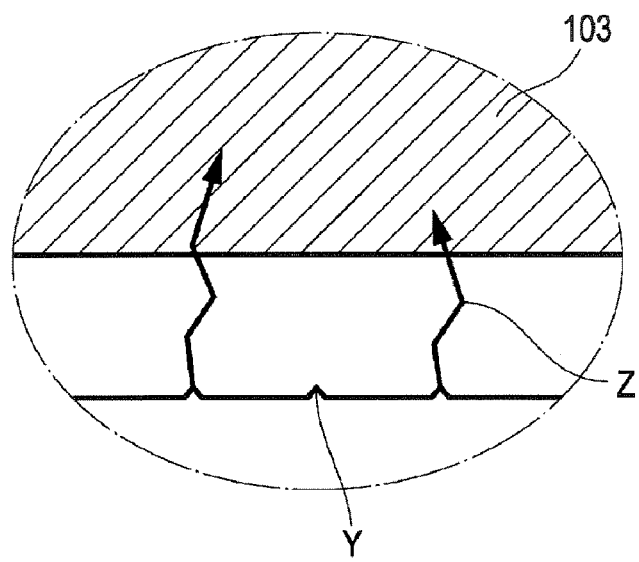
FIG. 3B is an illustration of an end portion X of another thin-film circuit device that has no low-strength region.

FIG. 3A is a plan view of the thin-film circuit device 100. FIG. 3B is an illustration of an end portion X of another thin-film circuit device that has no low-strength region. FIG. 3C is an illustration of an end portion X of the thin-film circuit device 100 that has a portion of the low-strength region 104.

The end portion X of the thin-film circuit device 100 has small notches Y formed in the cutting step. The notches Y can be present only in one of the substrate 101 and the thin-film circuit layer 102 or present in both of the substrate 101 and the thin-film circuit layer 102. The size and number of the notches Y depend on properties of at least one of the substrate 101 and the thin-film circuit layer 102 and a process for cutting the wafer 11. However, it is very difficult for any technique or process to completely prevent the formation of the notches Y.

The distortion or bend of the thin-film circuit device 100 or the change in the temperature of the thin-film circuit device 100 causes mechanical or thermal stresses in the substrate 101 and the thin-film circuit layer 102. Such stresses are concentrated on the edges of the notches Y present in the end portion X of the thin-film circuit device 100, thereby causing large cracks Z. Since the end portion X of the thin-film circuit device has no low-strength region as shown in FIG. 3B, such cracks Z propagate to inner portions of a thin-film circuit layer to reach an element region included in this thin-film circuit device. This can lead to a failure of this thin-film circuit device.

Figure 3C:
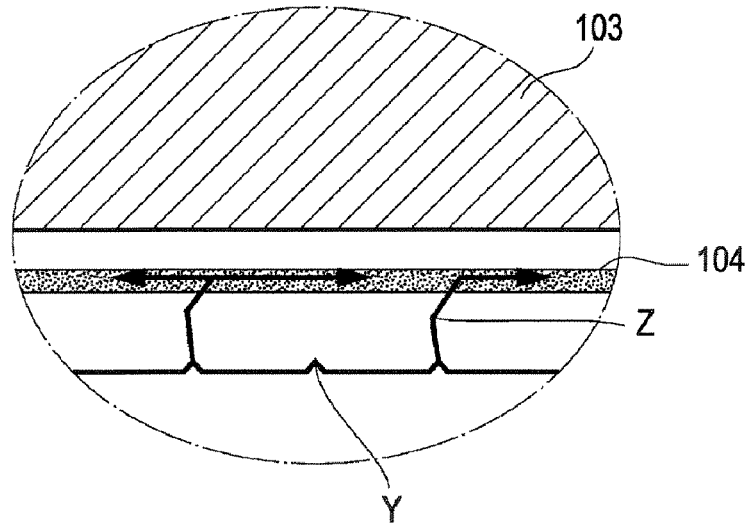
FIG. 3C is an illustration of an end portion X of the thin-film circuit device of the first embodiment, this end portion X having a portion of a low-strength region.

As shown in FIG. 3C, the low-strength region 104, which extends between the element region 103 and an end portion of the substrate 101, prevents the cracks Z present in the end portion X of the thin-film circuit device 100 from reaching the element region 103. When the cracks Z propagate toward an inner portion of the thin-film circuit layer 102, the cracks Z reach the low-strength region 104. The low-strength region 104 has a smaller mechanical strength as compared to the surroundings thereof. After the cracks Z reach the low-strength region 104, the cracks Z propagate in the low-strength region 104 in the direction in which the low-strength region 104 extends, because the cracks Z propagate toward a portion having a smaller mechanical strength. Once the cracks Z propagate in the low-strength region 104, an outer portion of the thin-film circuit layer 102 is separated from an inner portion of the thin-film circuit layer 102 with the cracks Z. Therefore, even if other cracks propagate to the low-strength region 104 from other end portions, these cracks can be prevented from propagating out of the low-strength region 104.

As described above, the low-strength region 104 extends between the element region 103 and the end portion of the substrate 101 to surround the element region 103. This prevents the cracks Z, which propagate from the end portion of the substrate 101, from reaching the element region 103, thereby preventing a failure of the thin-film circuit device 100. This allows the thin-film circuit device 100 to have high resistance to either one or both of a mechanical stress and a thermal stress.

The configuration of the low-strength region 104 will now be described in detail with reference to FIGS. 4A to 4D.

Figure 4A:
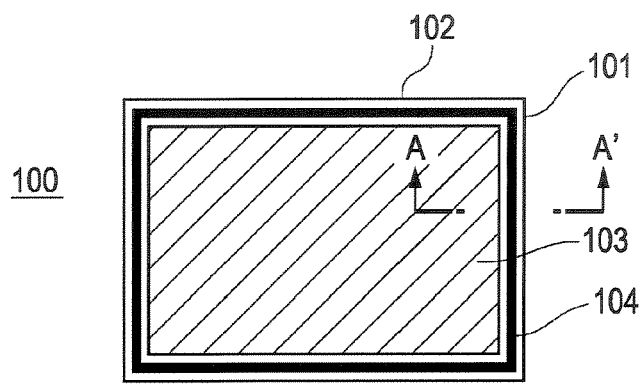
FIG. 4A is a plan view of the thin-film circuit device of the first embodiment and FIGS. 4B, 4C, and 4D are enlarged sectional views of the thin-film circuit device of the first embodiment taken along the line A-A'.
Figure 4B:
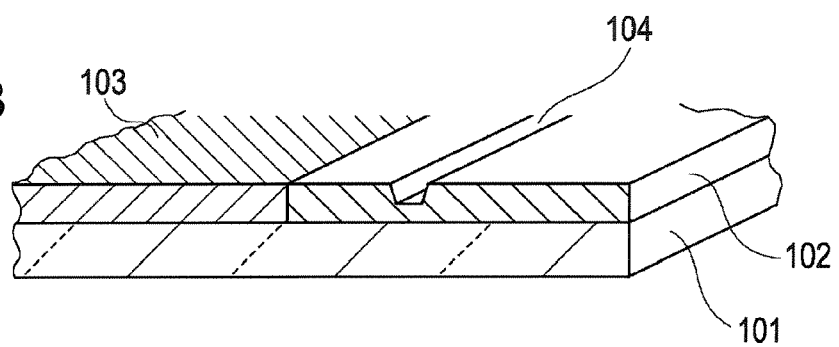
Figure 4C:
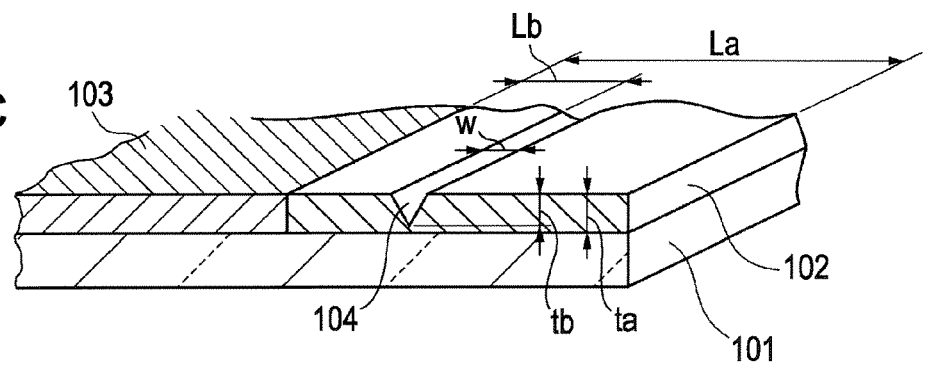
Figure 4D:
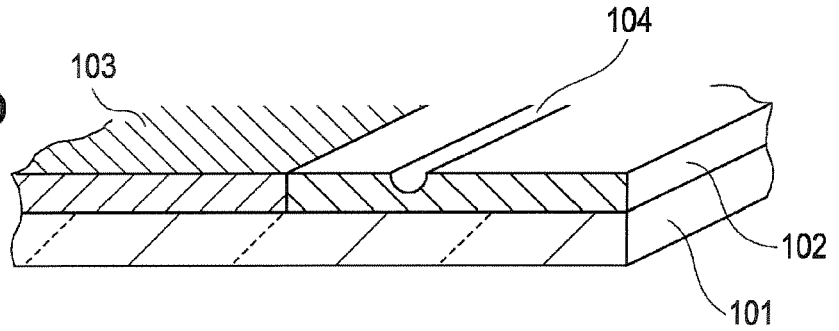

FIG. 4A is a plan view of the thin-film circuit device 100. FIGS. 4B, 4C, and 4D are enlarged sectional views of the thin-film circuit device 100 taken along the line A-A'.

As shown in FIG. 4B, the low-strength region 104 has a groove extending in the thin-film circuit layer 102. The groove has an inverted trapezoidal or rectangular shape in cross section. Therefore, a portion of the low-strength region 104 that corresponds to the bottom of the groove has a smaller thickness as compared to the surroundings of the low-strength region 104. This allows the low-strength region 104 to have a smaller mechanical strength as compared to the surroundings thereof.

Alternatively, the groove may have a V shape in cross section as shown in FIG. 4C. This allows the low-strength region 104 to have a smaller mechanical strength as compared to the surroundings thereof.

With reference to FIG. 4C, the distance between the element region 103 to an end of the thin-film circuit layer 102 is preferably about 3 mm (3,000 μm) or less. Mobile displays including thin-film transistors need to have a small size and therefore the thin-film circuit device 100 needs to have a narrow frame; hence, the distance therebetween is more preferably about 1 mm or less. The inequality Lb≧La/3 is preferably satisfied, wherein La represents the distance between the element region 103 and an end of the thin-film circuit layer 102 and Lb represents the distance between the element region 103 and the groove. The equation Lb=La/2 is more preferably satisfied because the groove is located substantially equidistantly from the element region 103 and an end of the thin-film circuit layer 102.

The groove preferably has a depth equal to 50% or more of the thickness of the thin-film circuit layer 102 as described below. The groove preferably reaches a silicon dioxide layer (the lowermost layer for TFTs) located under the thin-film circuit layer 102. This is because cracks can arise from the lowermost layer for the TFTs (because of the application of shear stresses between a film and the TFTs to the lowermost layer) and then readily propagate in the low-strength region 104. In consideration of the configuration of the TFTs, if the groove is formed by grinding the thin-film circuit layer 102 so as to extend from the upper face of the thin-film circuit layer 102 to a depth equal to about 85% of the thickness of the thin-film circuit layer 102, the groove will reach the silicon dioxide layer on a mathematical basis. The TFTs usually have a thickness of several to ten micrometers. Therefore, the inequality $t_b \geq t_a/2$ is preferably satisfied, wherein $t_a$ represents the thickness of the TFTs and $t_b$ represents the depth of the groove.

In consideration of a function of the low-strength region 104 subjected to stress concentration, the width and depth of the groove is preferably substantially equal to each other. The width of the groove may be greater than the depth thereof.

The groove can be formed in the low-strength region 104 by an etching process for semiconductor manufacture. Alternatively, the groove can be formed by a sandblast process, a water jet process, a laser process, or another process. The sandblast process is advantageous in that the groove can be formed so as to have a small width and the depth of the groove can be controlled in the order of several micrometers. The water jet process is advantageous in that both an organic material and an inorganic material can be uniformly processed. The laser process preferably uses femtosecond laser pulses because the groove can be readily formed with high efficiency.

Alternatively, the groove may have a semi-elliptical shape in cross section as shown in FIG. 4D. This also allows the low-strength region 104 to have a smaller mechanical strength as compared to the surroundings thereof.

The groove may have a semi-circular shape in cross section other than the V shape, the inverted trapezoidal shape, the rectangular shape, and the semi-elliptical shape or may partly have any one of these shapes in cross section.

Second Embodiment

Figure 5A:
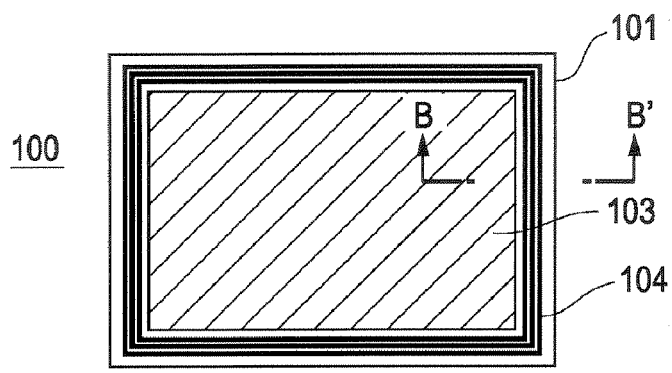
FIG. 5A is a plan view of a thin-film circuit device according to a second embodiment of the present invention and FIGS. 5B to 5D are enlarged sectional views of this thin-film circuit device taken along the line B-B'.

FIG. 5A shows a thin-film circuit device 100 according to a second embodiment of the present invention. The thin-film circuit device 100, as well as that of the first embodiment, includes a substrate 101 and a thin-film circuit layer 102 including an element region 103 and a low-strength region 104 surrounding the element region 103. The low-strength region 104 has a plurality of grooves.

Figure 5B:
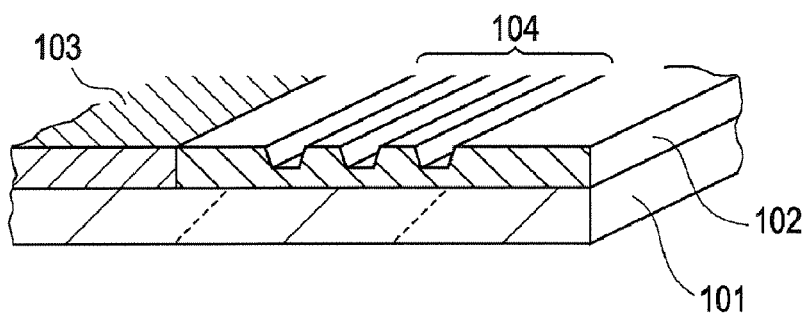
Figure 5C:
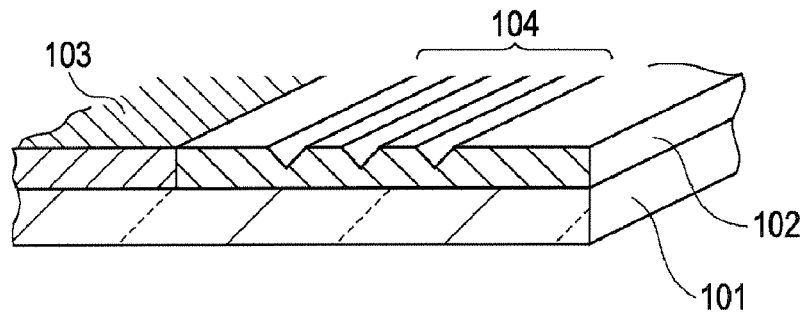

FIGS. 5B to 5C are enlarged sectional views of the thin-film circuit device 100, shown in FIG. 5A, taken along the line B-B'.

Figure 5D:
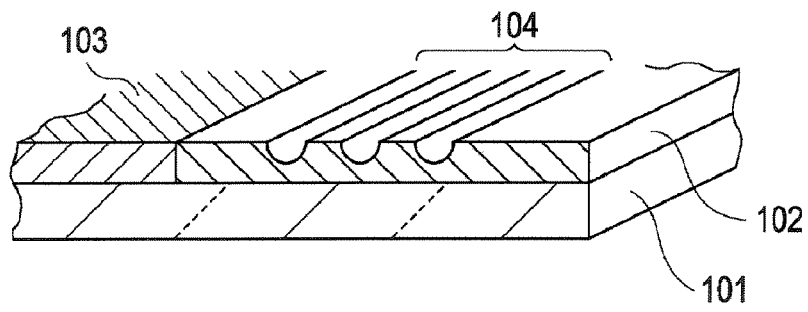

The grooves may have a rectangular or inverted trapezoidal shape in cross section as shown in FIG. 5B, a V shape in cross section as shown in FIG. 5C, or a semi-elliptical shape in cross section as shown in FIG. 5D. Alternatively, the grooves may have a semi-circular shape in cross section or may partly have any one of these shapes in cross section.

According to this configuration, even if cracks are developed in an end portion of the thin-film circuit device 100, the risk that the cracks propagate through the low-strength region 104 to extend inward can be reduced. This allows the thin-film circuit device 100 to have high reliability.

With reference to FIG. 5B to 5D, the number of the grooves is three. However, the number thereof is not limited to three. An increase in the number of the grooves enhances the ability of the low-strength region 104 to prevent the propagation of the cracks. A reduction in the number of the grooves reduces the area of the low-strength region 104 as long as the number thereof is sufficient to prevent the propagation of the cracks. This leads to a reduction in the size of the thin-film circuit device 100.

Accordingly, the number of the grooves is preferably two to five and more preferably two or three.

An increase in the depth of the grooves enhances the ability of the low-strength region 104 to prevent the propagation of the cracks. Therefore, the depth of the grooves is preferably 20% or more of the thickness of the thin-film circuit layer 102 and more preferably 50% or more of the thickness thereof.

Figure 6A:
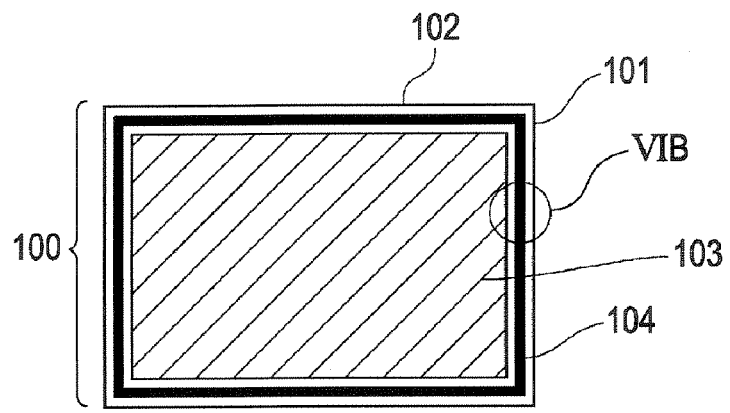
FIG. 6A is a plan view of the thin-film circuit device of the second embodiment and FIGS. 6B(a) to 6B(e) are illustrations showing variations of the pattern of grooves present in this thin-film circuit device.
Figure 6B:
Figure 6B:
Figure 6B:
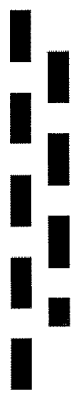
Figure 6B:
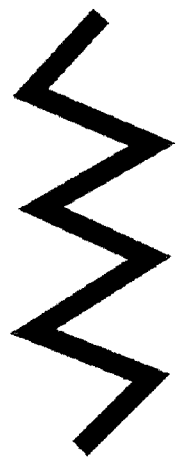
Figure 6B:
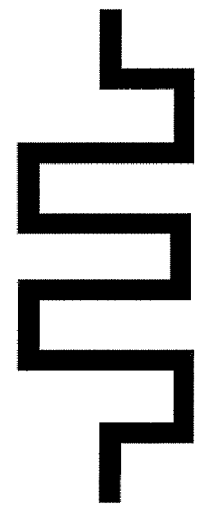

FIG. 6A is a plan view of the thin-film circuit device 100. FIGS. 6B(a) to 6B(e) are illustrations showing variations of the pattern of the grooves. The grooves are straight as shown in FIG. 6B(a).

Alternatively, the grooves may be as follows: at least one of the grooves is straight and long (this groove is referred to as a straight groove) and the others are straight and short and are arranged in a straight line (these grooves are referred to as spaced grooves) as shown in FIG. 6B(b). The straight groove is located close to the element region 103 and the spaced grooves are located outside the straight groove. This allows the thin-film circuit device 100 to have a sufficient strength and prevents the cracks from propagating from an outer portion (an end face of a chip).

The spaced grooves may be arranged in two straight lines such that the spaces between the spaced grooves are covered with the corresponding spaced grooves when the spaced grooves are viewed from a side of the substrate 101 as shown in FIG. 6B(c). This also allows the thin-film circuit device 100 to have a sufficient strength and prevents the cracks from propagating from an outer portion (an end face of a chip).

One of the grooves may form periodic triangular waves as shown in FIG. 6B(d). This configuration is effective in distributing the cracks or stresses propagating from sides of the substrate 101 in various directions. Portions of this groove extend in the propagation directions of the cracks or stresses; hence, the cracks or the stresses can be effectively guided to this groove.

One of the grooves may form periodic rectangular waves as shown in FIG. 6B(e). This configuration is also effective in distributing the cracks or stresses propagating from sides of the substrate 101 in various directions. Portions of this groove extend in the propagation directions of the cracks or stresses; hence, the cracks or the stresses can be effectively guided to this groove.

In the grooves shown in FIG. 6B(d) or 6B(e), the corners of the triangular or rectangular waves may be rounded. The patterns shown in FIGS. 6B(a) to 6B(e) may be used in combination.

The grooves preferably extend uniformly along the four sides of the substrate 101. Although the cracks can propagate in any direction, the grooves extending uniformly along the four sides thereof can securely prevent the cracks from reaching the element region 103.

Third Embodiment

A method for manufacturing a thin-film circuit device according to a third embodiment of the present invention will now be described with reference to FIGS. 7A to 7G. In the method, a silicon thin-film for forming planar thin-film transistors is used as an etching stopper in a step of forming grooves having a rectangular shape in cross section.

Figure 7A:
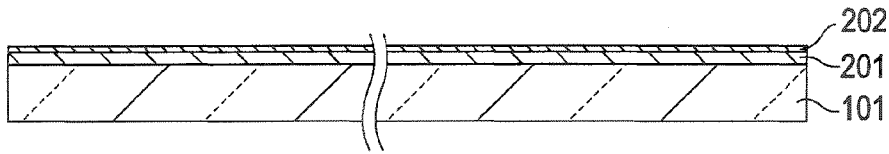
FIGS. 7A to 7G are illustrations showing steps included in a method for manufacturing a thin-film circuit device according to a third embodiment of the present invention.

As shown in FIG. 7A, a protective layer 201 is formed on a substrate 101 by a CVD process or another process using silicon dioxide or another compound. A silicon layer is formed on the protective layer 201 by a CVD process or another process. The silicon layer is subjected to laser crystallization and then heat treatment, whereby the silicon layer is converted into a polysilicon layer 202.

Figure 7B:
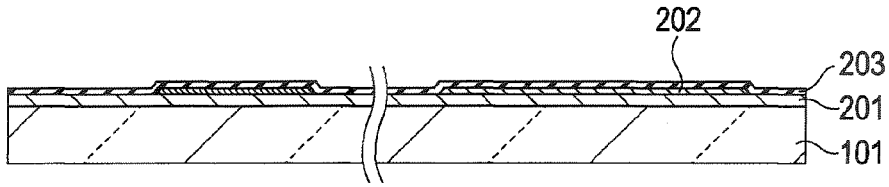

As shown in FIG. 7B, the polysilicon layer 202 is patterned, whereby a transistor-forming region and a low-strength region 104 serving as an etching stopper region are formed. Silicon dioxide is deposited over these regions by a CVD process, whereby a gate insulating layer 203 is formed.

Figure 7C:
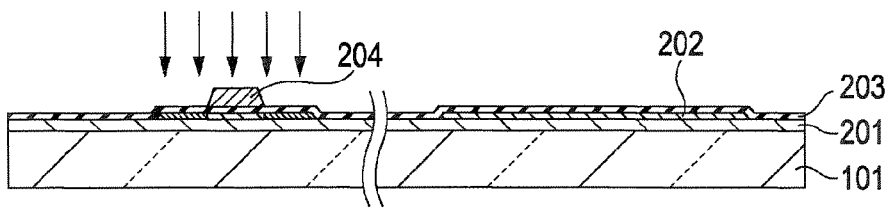

As shown in FIG. 7C, a layer of a conductive material such as aluminum is deposited on the gate insulating layer 203 by a sputtering process or another process and then patterned, whereby a gate electrode-wiring layer 204 is formed. Impurities are implanted into the transistor-forming region using the gate electrode-wiring layer 204 as a mask. The impurities are then activated by heat treatment or the like, whereby source regions and drain regions are formed.

Figure 7D:
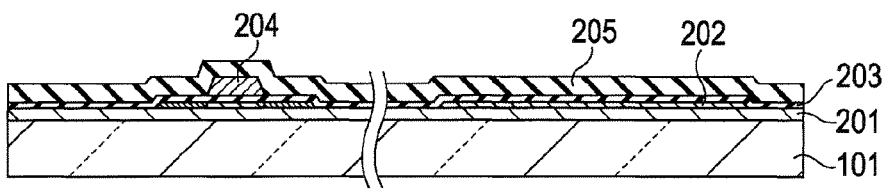

As shown in FIG. 7D, silicon dioxide is deposited over the gate insulating layer 203 and the gate electrode-wiring layer 204 by a CVD process, whereby an interlayer insulating layer 205 is formed.

Figure 7E:
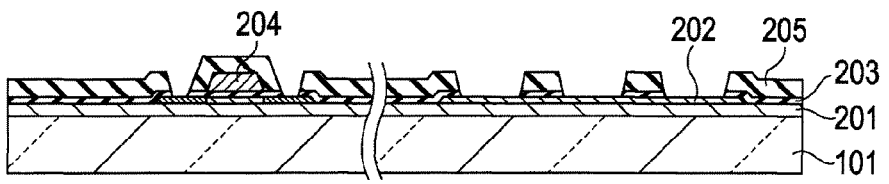

As shown in FIG. 7E, the interlayer insulating layer 205 and the gate insulating layer 203 are patterned by an etching process, whereby contact holes are formed in the transistor-forming region so as to extend to the respective source and drain regions. In this step, the grooves are formed in the low-strength region 104. An etching solution used contains, for example, hydrofluoric acid (HF) and water ($H_2O$) so as to have a large selective etching ratio with respect to silicon dioxide and silicon. The polysilicon layer 202 serves as an etching stopper.

Figure 7F:
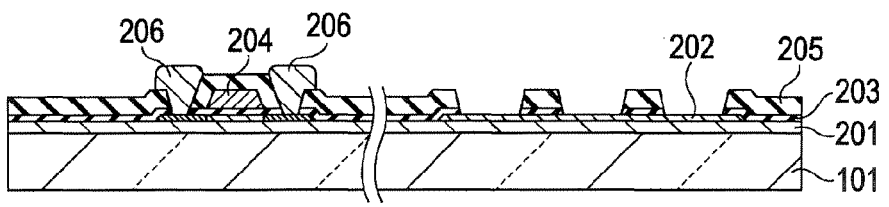

As shown in FIG. 7F, a layer of a conductive material such as aluminum is deposited on the interlayer insulating layer 205 by a sputtering process and then patterned, whereby source and drain electrodes 206 are formed.

Figure 7G:
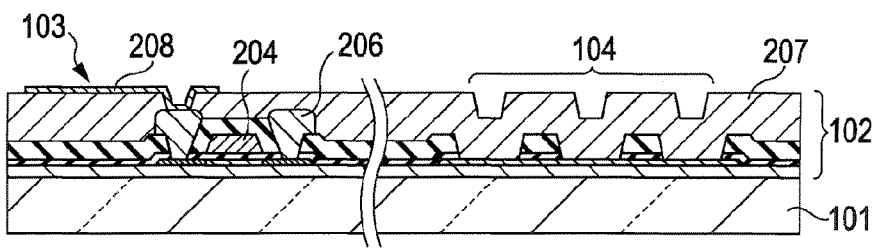

As shown in FIG. 7G, silicon nitride or silicon dioxide is deposited over the interlayer insulating layer 205 and the source and drain electrodes 206, whereby a protective layer 207 is formed. Contact holes are formed in the protective layer 207. A layer of a conductive material is deposited on the protective layer 207 and then patterned, whereby a wiring layer 208 connected to transistor electrodes is formed.

This provides a thin-film circuit layer 102 disposed on the substrate 101. The thin-film circuit layer 102 includes an element region 103 and the low-strength region 104 surrounding the element region 103. The element region 103 includes the transistors. In the method, as shown in FIG. 7E, the grooves can be formed in the low-strength region 104 in the step of forming the contact holes extending to the source and drain electrodes 206.

Fourth Embodiment

A method for manufacturing a thin-film circuit device according to a fourth embodiment of the present invention will now be described with reference to FIGS. 8A to 8G. In the method, a gate electrode material for forming planar thin-film transistors is used as an etching stopper in a step of forming grooves having a rectangular shape in cross section.

Figure 8A:
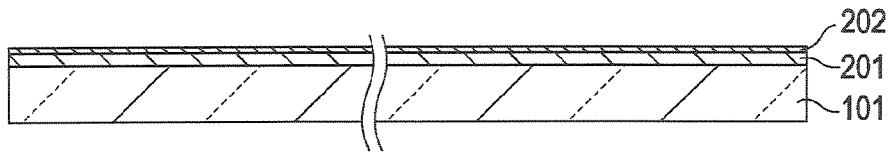
FIGS. 8A to 8G are illustrations showing steps included in a method for manufacturing a thin-film circuit device according to a fourth embodiment of the present invention.

As shown in FIG. 8A, a protective layer 201 is formed on a substrate 101 by a CVD process or another process using silicon dioxide or another compound. A silicon layer is formed on the protective layer 201 by a CVD process or another process. The silicon layer is subjected to laser crystallization and then heat treatment, whereby the silicon layer is converted into a polysilicon layer 202.

Figure 8B:
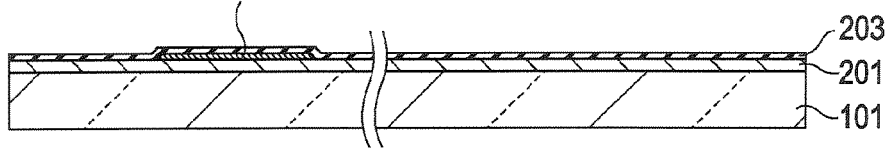

As shown in FIG. 8B, the polysilicon layer 202 is patterned, whereby a transistor-forming region is formed. Silicon dioxide is deposited on the polysilicon layer 202 by a CVD process, whereby a gate insulating layer 203 is formed.

Figure 8C:
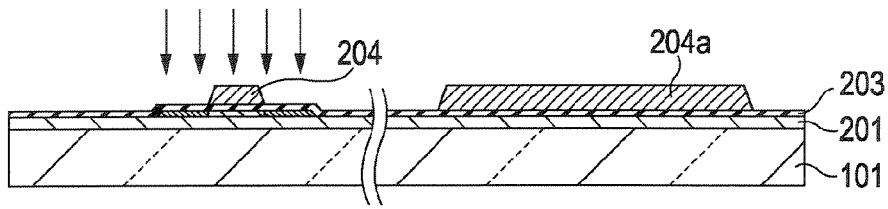

As shown in FIG. 8C, a layer of a conductive material such as aluminum is deposited on the gate insulating layer 203 by a sputtering process or another process and then patterned, whereby a gate electrode-wiring layer 204 and an etching stopper layer 204a are formed. The etching stopper layer 204a is located in a low-strength region 104. Impurities are implanted into the transistor-forming region present in the polysilicon layer 202 using the gate electrode-wiring layer 204 as a mask. The impurities are then activated by heat treatment or the like, whereby source regions and drain regions are formed.

Figure 8D:
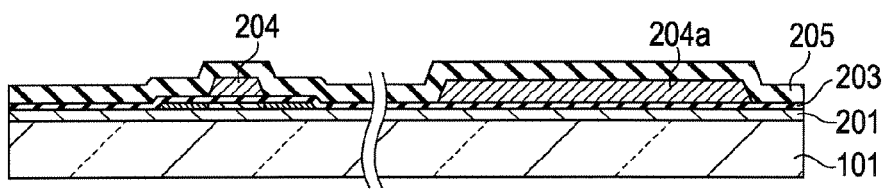

As shown in FIG. 8D, silicon dioxide is deposited over the gate insulating layer 203 and the gate electrode-wiring layer 204 by a CVD process, whereby an interlayer insulating layer 205 is formed.

Figure 8E:
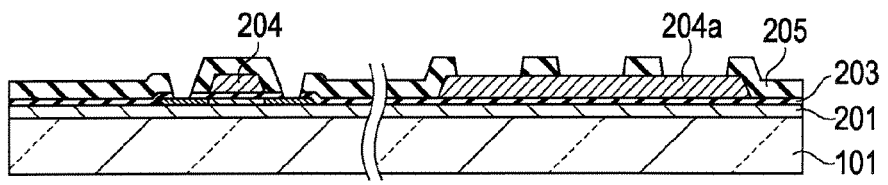

As shown in FIG. 8E, the interlayer insulating layer 205 and the gate insulating layer 203 are patterned by an etching process, whereby contact holes are formed in the transistor-forming region so as to extend to the respective source and drain regions. In this step, the grooves are formed in a low-strength region 104 in such a manner that the interlayer insulating layer 205 is patterned using the etching stopper layer 204a as a mask. An etching solution used contains, for example, hydrofluoric acid such that the etching solution has a high etching rate with respect to the interlayer insulating layer 205 and a low etching rate with respect to the etching stopper layer 204a.

Figure 8F:
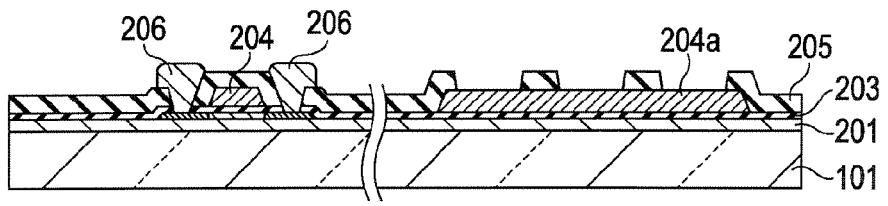

As shown in FIG. 8F, a layer of a conductive material such as aluminum is deposited on the interlayer insulating layer 205 by a sputtering process and then patterned, whereby source and drain electrodes 206 are formed.

Figure 8G:
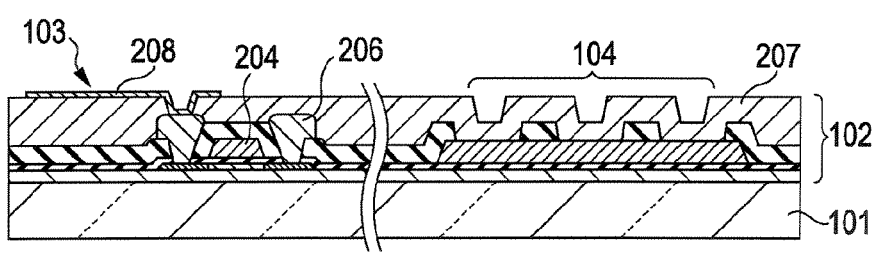

As shown in FIG. 8G, silicon nitride or silicon dioxide is deposited over the interlayer insulating layer 205 and the source and drain electrodes 206, whereby a protective layer 207 is formed. Contact holes are formed in the protective layer 207. A layer of a conductive material is deposited on the protective layer 207 and then patterned, whereby a wiring layer 208 connected to transistor electrodes is formed.

This provides a thin-film circuit layer 102 disposed on the substrate 101. The thin-film circuit layer 102 includes an element region 103 and the low-strength region 104 surrounding the element region 103. The element region 103 includes the transistors. In the method, as shown in FIG. 8E, the grooves can be formed in the low-strength region 104 in the step of forming the contact holes extending to the source and drain electrodes 206.

Fifth Embodiment

A fifth embodiment of the present invention provides a method for manufacturing a thin-film circuit device including inverted staggered thin-film transistors. In the method, gate electrodes included in the inverted staggered thin-film transistors are used as etching stoppers in a step of forming grooves having a rectangular shape in cross section.

Sixth Embodiment

A method for manufacturing a thin-film circuit device according to a sixth embodiment of the present invention will now be described with reference to FIGS. 9A to 9G. In the method, a base layer for forming planar thin-film transistors is used as an etching stopper in a step of forming grooves having a rectangular shape in cross section. Although the method is described using a procedure for fabricating the planar thin-film transistors, the method can be used regardless of the type of thin-film transistors.

Figure 9A:
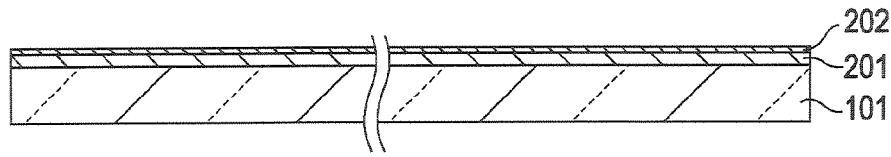
FIGS. 9A to 9G are illustrations showing steps included in a method for manufacturing a thin-film circuit device according to a sixth embodiment of the present invention.

As shown in FIG. 9A, a protective layer 201 is formed on a substrate 101 by a CVD process or another process using silicon nitride or another compound. A silicon layer is formed on the protective layer 201 by a CVD process or another process. The silicon layer is subjected to laser crystallization and then heat treatment, whereby the silicon layer is converted into a polysilicon layer 202.

Figure 9B:
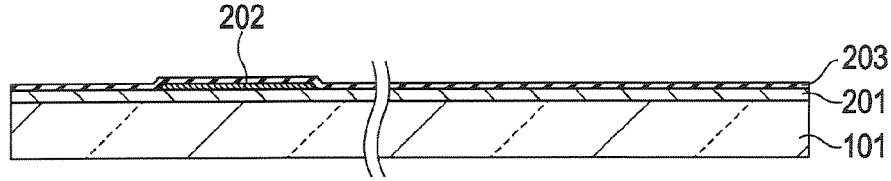

As shown in FIG. 9B, the polysilicon layer 202 is patterned, whereby a transistor-forming region is formed. Silicon dioxide is deposited on the polysilicon layer 202 by a CVD process, whereby a gate insulating layer 203 is formed.

Figure 9C:
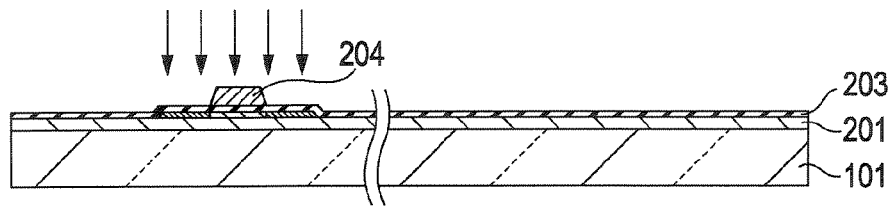

As shown in FIG. 9C, a layer of a conductive material such as aluminum is deposited on the gate insulating layer 203 by a sputtering process or another process and then patterned, whereby a gate electrode-wiring layer 204 is formed. Impurities are implanted into the transistor-forming region using the gate electrode-wiring layer 204 as a mask. The impurities are then activated by heat treatment or the like, whereby source regions and drain regions are formed.

Figure 9D:
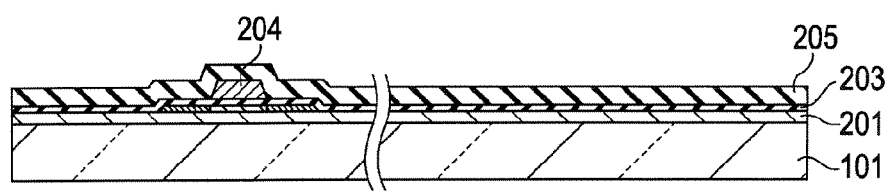

As shown in FIG. 9D, silicon dioxide is deposited over the gate insulating layer 203 and the gate electrode-wiring layer 204 by a CVD process, whereby an interlayer insulating layer 205 is formed.

Figure 9E:
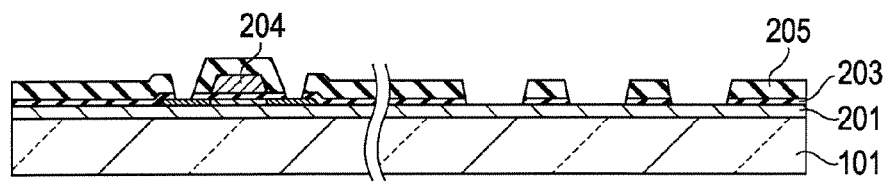

As shown in FIG. 9E, the interlayer insulating layer 205 and the gate insulating layer 203 are patterned by an etching process, whereby contact holes are formed in the transistor-forming region so as to extend to the respective source and drain regions. In this step, the grooves are formed in a low-strength region 104. An etching solution used contains, for example, HF and H$_2$O so as to have a large etching rate with respect to silicon dioxide and a small etching rate with respect to silicon and silicon nitride. The protective layer 201, which is made of silicon nitride, serves as an etching stopper.

Figure 9F:
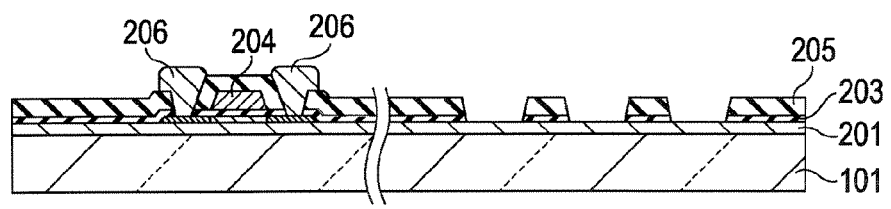

As shown in FIG. 9F, a layer of a conductive material such as aluminum is deposited on the interlayer insulating layer 205 by a sputtering process and then patterned, whereby source and drain electrodes 206 are formed.

Figure 9G:
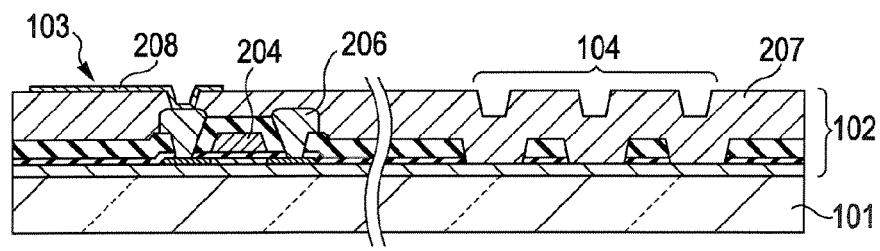

As shown in FIG. 9G, silicon nitride or silicon dioxide is deposited over the interlayer insulating layer 205 and the source and drain electrodes 206, whereby a protective layer 207 is formed. Contact holes are formed in the protective layer 207. A layer of a conductive material is deposited on the protective layer 207 and then patterned, whereby a wiring layer 208 connected to transistor electrodes is formed.

This provides a thin-film circuit layer 102 disposed on the substrate 101. The thin-film circuit layer 102 includes an element region 103 and the low-strength region 104 surrounding the element region 103. The element region 103 includes the transistors. In the method, as shown in FIG. 9E, the grooves can be formed in the low-strength region 104 in the step of forming the contact holes extending to the source and drain electrodes 206.

Seventh Embodiment

A method for manufacturing a thin-film circuit device according to a seventh embodiment of the present invention will now be described with reference to FIGS. 10A to 10E. In the method, grooves having a rectangular shape in cross section are formed by processing an interlayer insulating layer for forming thin-film transistors. Although the method is described using a procedure for fabricating planar thin-film transistors, the method can be used regardless of the type of thin-film transistors.

Figure 10A:
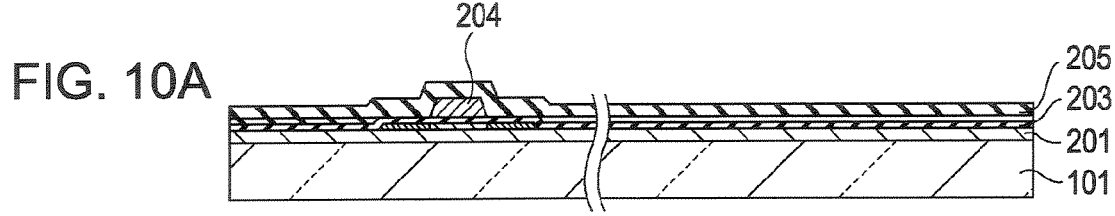
FIGS. 10A to 10E are illustrations showing steps included in a method for manufacturing a thin-film circuit device according to a seventh embodiment of the present invention.

As shown in FIG. 10A, an interlayer insulating layer 205 is formed by the same procedure as that described with reference to FIGS. 9A to 9D.

Figure 10B:
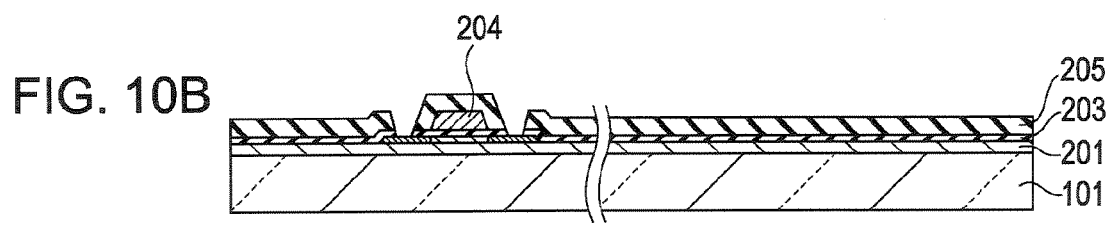

As shown in FIG. 10B, the interlayer insulating layer 205 and a gate insulating layer 203 are patterned, whereby contact holes are formed in a transistor-forming region so as to extend to source and drain regions.

Figure 10C:
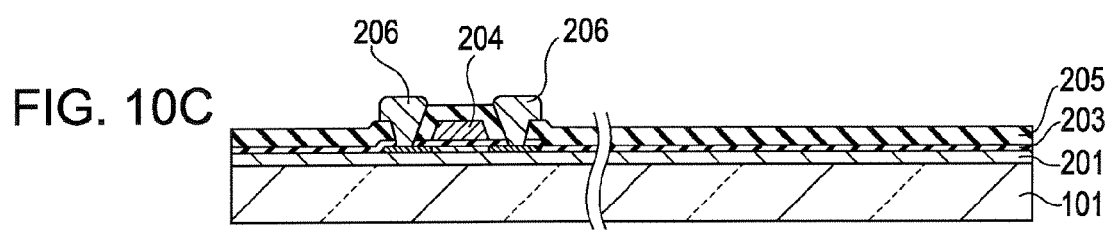

As shown in FIG. 10C, a layer of a conductive material such as aluminum is deposited on the interlayer insulating layer 205 by a sputtering process and then patterned, whereby source and drain electrodes 206 are formed.

Figure 10D:
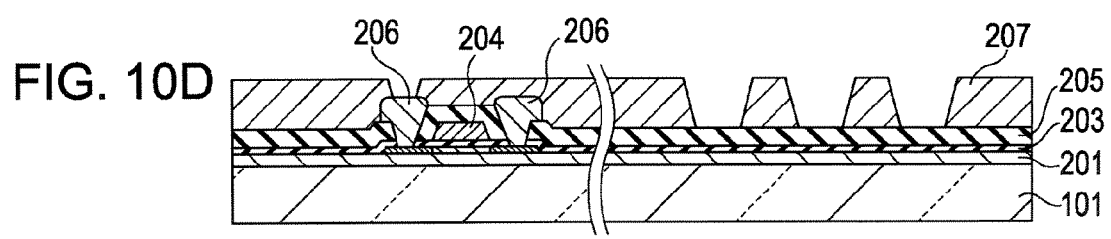

As shown in FIG. 10D, silicon nitride or silicon dioxide is deposited over the interlayer insulating layer 205 and the source and drain electrodes 206, whereby a protective layer 207 is formed. The protective layer 207 is patterned, whereby contact holes are formed on the source regions and the drain regions and the grooves are formed in a low-strength region 104 located in the protective layer 207.

Figure 10E:
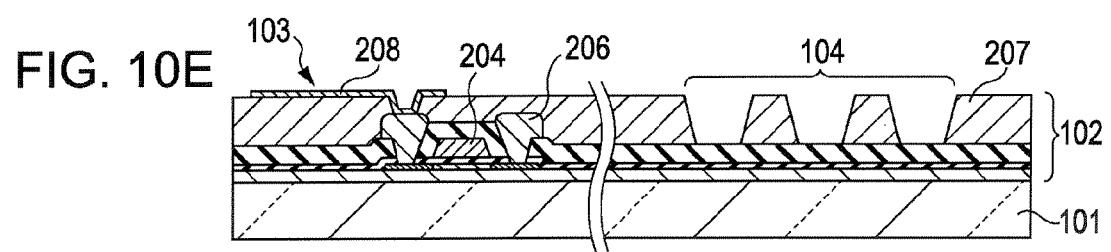

As shown in FIG. 10E, a layer of a conductive material is deposited on the protective layer 207 and then patterned, whereby a wiring layer 208 connected to transistor electrodes is formed.

This provides a thin-film circuit layer 102 disposed on the substrate 101. The thin-film circuit layer 102 includes an element region 103 and the low-strength region 104 surrounding the element region 103. The element region 103 includes the transistors. In the method, as shown in FIG. 10D, the grooves can be formed in the low-strength region 104 in the step of forming the contact holes extending to the source and drain electrodes 206.

Eighth Embodiment

A method for manufacturing a thin-film circuit device according to an eighth embodiment of the present invention will now be described with reference to FIGS. 11A and 11B. In this embodiment, a step of forming grooves having a V shape in cross section is described in detail. Although the method is described using a procedure for fabricating planar thin-film transistors, the method can be used regardless of the type of thin-film transistors.

Figure 11A:
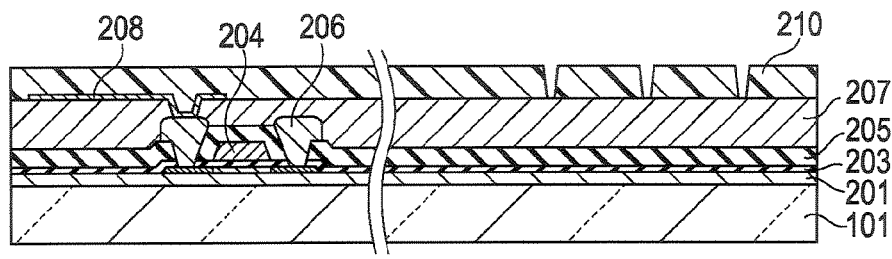
FIGS. 11A and 11B are illustrations showing steps included in a method for manufacturing a thin-film circuit device according to an eighth embodiment of the present invention.

FIG. 11A shows a thin-film circuit substrate including thin-film transistors fabricated by a procedure for fabricating the planar thin-film transistors described above (for example, a procedure including steps which are similar to those shown in FIGS. 10A to 10E and in which no low-strength region is formed). A photoresist 210 is applied to a protective layer 207 disposed above the substrate by a spin-coating process or another process. A photomask, which is not shown, having a pattern corresponding to the grooves is placed on the photoresist 210. The photoresist 210 is lightly exposed and then developed. This allows the photoresist 210 to have a plurality of V-shaped grooves corresponding to those grooves. The protective layer 207 is anisotropically etched using the photoresist 210 as a mask, whereby the V-shaped grooves are transferred to the protective layer 207. The photoresist 210 is removed and the substrate is then cleaned.

Figure 11B:
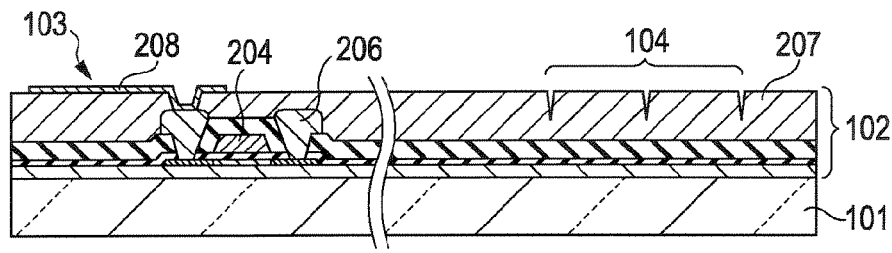

This provides the thin-film circuit device having those grooves as shown in FIG. 11B. Those grooves extend in a portion of the protective layer 207 that corresponds to a low-strength region 104.

Ninth Embodiment

A method for manufacturing a thin-film circuit device according to a ninth embodiment of the present invention will now be described with reference to FIGS. 12A and 12B. In this embodiment, a step of forming grooves which have a semi-elliptical or semi-circular shape in cross section or which partly have such a shape in cross section is described in detail. Although the method is described using a procedure for fabricating planar thin-film transistors, the method can be used regardless of the type of thin-film transistors.

Figure 12A:
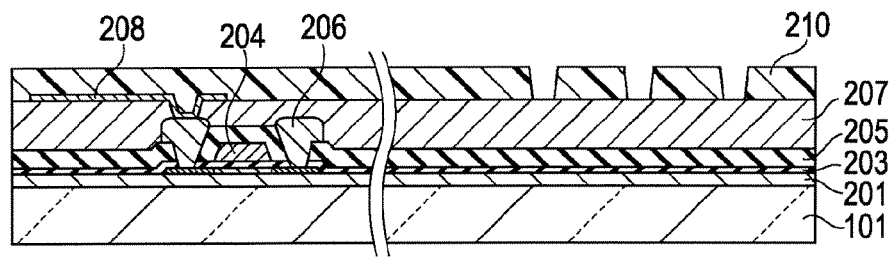
FIGS. 12A and 12B are illustrations showing steps included in a method for manufacturing a thin-film circuit device according to a ninth embodiment of the present invention.

FIG. 12A shows a thin-film circuit substrate including thin-film transistors fabricated by a procedure for fabricating the planar thin-film transistors described above (for example, a procedure including steps which are similar to those shown in FIGS. 10A to 10E and in which no low-strength region is formed). A photoresist 210 is applied to a protective layer 207 disposed above the substrate by a spin-coating process or another process. A photomask, which is not shown, having a pattern corresponding to the grooves is placed on the photoresist 210. The photoresist 210 is strongly exposed and then developed. This allows the photoresist 210 to have a plurality of inverted trapezoid-shaped grooves corresponding to those grooves. The protective layer 207 is wet-etched with an etching solution using the photoresist 210 as a mask, whereby the inverted trapezoid-shaped grooves are transferred to the protective layer 207. The grooves transferred to the protective layer 207 have a semi-elliptical or semi-circular shape depending on properties of the etching solution. The photoresist 210 is removed and the substrate is then cleaned.

Figure 12B:
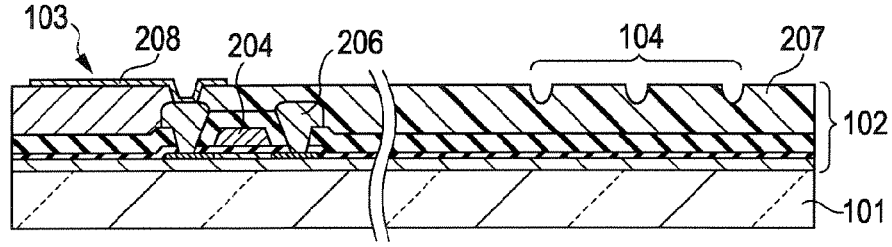

This provides the thin-film circuit device having those grooves as shown in FIG. 12B. Those grooves extend in a portion of the protective layer 207 that corresponds to a low-strength region 104.

As described above, the low-strength region 104 can be formed in a thin-film circuit layer 102 including thin-film transistors.

Tenth Embodiment

A method for manufacturing thin-film circuit devices 100 according to a tenth embodiment of the present invention will now be described with reference to FIGS. 13A to 13D and 14A to 14D. The thin-film circuit devices 100 are flexible and are manufactured in such a manner that thin-film circuit layers 102 including low-strength regions 104 are formed above a substrate 101 made of glass and the thin-film circuit layers 102 are transferred to a flexible resin film.

The thin-film circuit devices 100 are similar to the thin-film circuit device 100 of Seventh Embodiment described with reference to FIGS. 10A to 10E. The thin-film circuit device according to any one of the other embodiments may be used to describe the method of this embodiment.

Figure 13A:
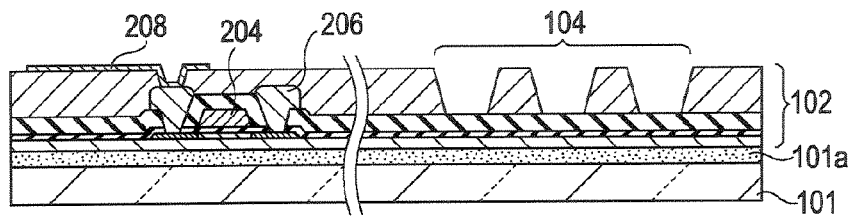
FIGS. 13A to 13D are illustrations showing steps included in a method for manufacturing a thin-film circuit device according to a tenth embodiment of the present invention.

As shown in FIG. 13A, an amorphous silicon layer 101a serving as a release layer is formed on the substrate 101 by a CVD process. The thin-film circuit layers 102 are formed on the amorphous silicon layer 101a by the same procedure as that described in Seventh Embodiment.

Figure 13B:
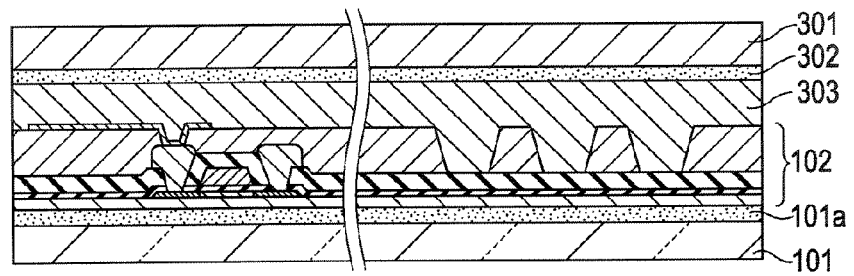

As shown in FIG. 13B, the thin-film circuit layers 102 are joined to a release layer 302, made of amorphous silicon, lying on a temporary transfer substrate 301 with a water-soluble adhesive 303.

Figure 13C:
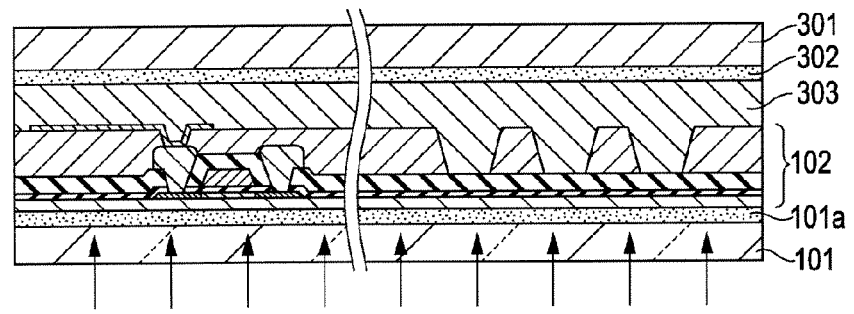

As shown in FIG. 13C, the lower face of the substrate 101 is irradiated with laser beams, whereby the bonds between silicon atoms in the amorphous silicon layer 101a are broken.

Figure 13D:
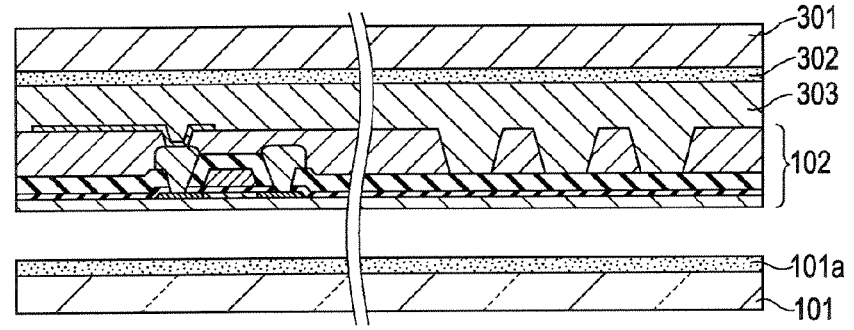

As shown in FIG. 13D, the substrate 101 is separated from the thin-film circuit layers 102. The thin-film circuit layers 102 remain under the temporary transfer substrate 301.

Figure 14A:
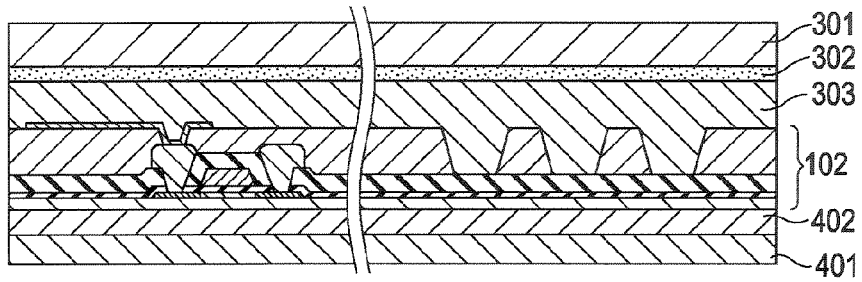
FIGS. 14A to 14D are illustrations showing steps included in a method for manufacturing a thin-film circuit device according to a eleventh embodiment of the present invention.

As shown in FIG. 14A, the thin-film circuit layers 102 are joined to a flexible resin substrate 401 with a water-insoluble adhesive 402.

Figure 14B:
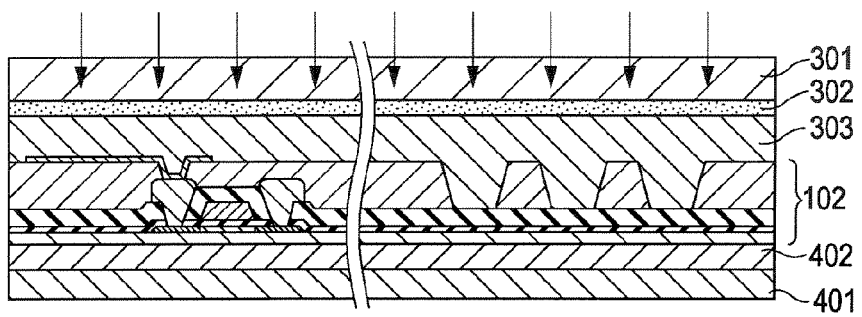

As shown in FIG. 14B, the upper face of the temporary transfer substrate 301 is irradiated with laser beams, whereby the bonds between silicon atoms in the release layer 302 are broken.

Figure 14C:
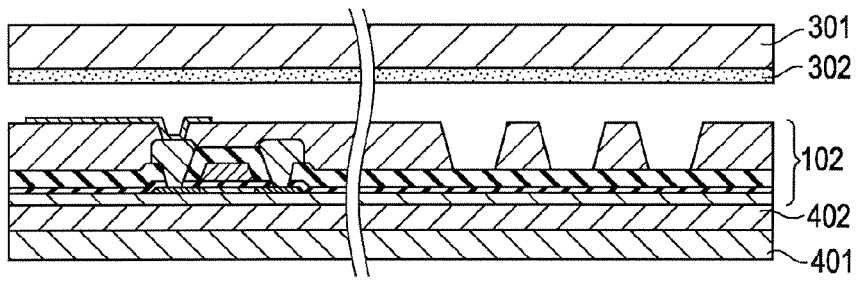

As shown in FIG. 14C, the temporary transfer substrate 301 is separated from the thin-film circuit layer 102. The thin-film circuit layers 102 remain on the resin substrate 401. The water-soluble adhesive 303 is removed by water washing.

Figure 14D:
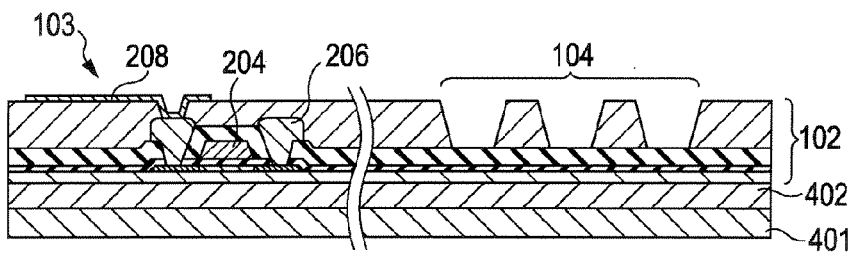

As shown in FIG. 14D, the thin-film circuit devices 100 are obtained. The thin-film circuit devices 100 include the thin-film circuit layers 102 including element regions 103 and low-strength regions 104 surrounding the respective element regions 103. The thin-film circuit devices 100, as well as those shown in FIG. 2, are arranged above the resin substrate 401.

The above method is called a release transfer process, which is useful in manufacturing thin-film circuit devices at high temperature. These thin-film circuit devices include transistors having higher performance than that of transistors that are directly fabricated above a flexible substrate having low heat resistance at low temperature.

Eleventh Embodiment

An electronic apparatus according to an eleventh embodiment of the present invention will now be described. The electronic apparatus includes the thin-film circuit device according to any one of the above embodiments.

Figure 15A:
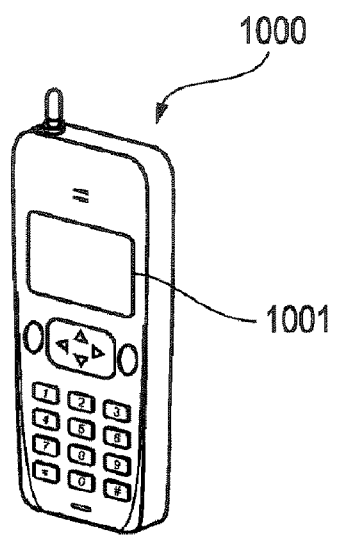
FIGS. 15A to 15C are illustrations of examples of an electronic apparatus including the thin-film circuit device according to any one of the above embodiments.
Figure 15B:
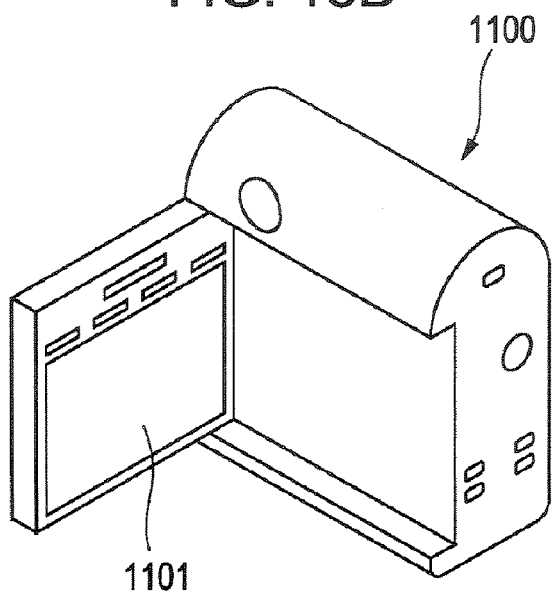
Figure 15C:
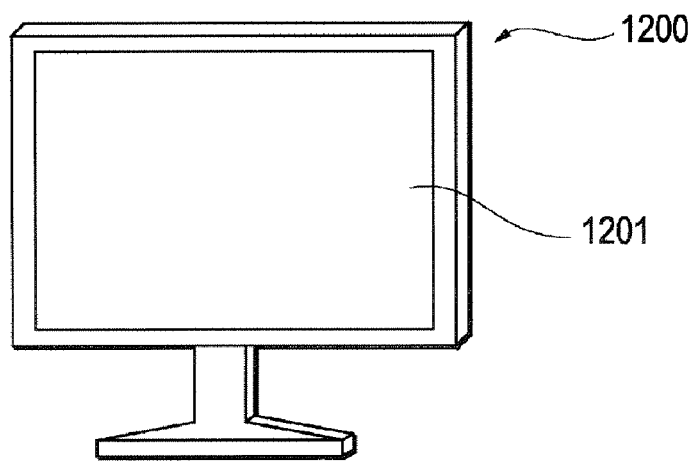

FIGS. 15A to 15C are illustrations of examples of the electronic apparatus. FIG. 15A shows a mobile phone 1000 including a display section 1001. The display section 1001 includes an electro-optical unit including the thin-film circuit device. The electro-optical unit further includes a liquid crystal display panel, an organic electroluminescent (EL) panel, an electrophoretic display panel, or another panel.

FIG. 15B shows a video camera 1100 including a display section 1101. The display section 1101 includes an electro-optical unit including the thin-film circuit device.

FIG. 15C shows a television 1200 including a display section 1201. The display section 1201 includes an electro-optical unit including the thin-film circuit device. An electro-optical unit including the thin-film circuit device can be used for a monitor for personal computers.

Examples of the electronic apparatus include facsimile machines, digital cameras, portable televisions, personal digital assistants (PDAs), electronic notebooks, electronic billboards, and advertising displays.

As described above, a thin-film circuit device according to a preferred embodiment of the present invention is advantageous in that a low-strength region can prevent cracks developed in an end portion of the thin-film circuit device from propagating to an element region. That is, the cracks reach the low-strength region and then propagate in the low-strength region in the direction in which the low-strength region extends. Since the element region is surrounded by the low-strength region, the cracks are prevented from propagating to the element region. This protects the element region.

What is claimed is:

1. A thin-film circuit device comprising:
    a substrate;
    a thin-film circuit layer disposed on the substrate, the thin-film circuit layer having an element region; and
    a low-strength region provided in the thin-film circuit layer, the low strength region extending between an end portion of the thin-film circuit layer and the element region,
    wherein the thin-film circuit layer includes a first protective layer provided on the substrate, a thin-film transistor provided on the first protective layer in the element region, and a second protective layer covering the thin-film transistor,
    wherein the low-strength region has a groove formed in the second protective layer, the groove surrounding the element region, and
    wherein the groove has a depth equal to at least one half of a thickness of the thin-film circuit layer.

2. The thin-film circuit device according to claim 1, wherein the low-strength region surrounds the element region several times.

3. The thin-film circuit device according to claim 1, wherein the low-strength region has a plurality of grooves surrounding the element region.

4. The thin-film circuit device according to claim 1, wherein the groove has a V shape, an inverted trapezoidal shape, a rectangular shape, a semi-circular shape, or a semi-elliptical shape in cross section or partly has any one of these shapes in cross section.

5. The thin-film circuit device according to claim 1, wherein the groove reaches the first protective layer.

6. An electronic apparatus comprising the thin-film circuit device according to claim 1.

7. An electronic apparatus comprising the thin-film circuit device according to claim 5.

8. The thin-film circuit device according to claim 1, wherein the low-strength region has a mechanical strength less than that of the surroundings of the low-strength region.

* * * * *